United States Patent [19]

Levine et al.

[11] Patent Number: 5,069,740
[45] Date of Patent: Dec. 3, 1991

[54] PRODUCTION OF SEMICONDUCTOR GRADE SILICON SPHERES FROM METALLURGICAL GRADE SILICON PARTICLES

[75] Inventors: Jules D. Levine, Dallas; Millard J. Jensen, Balch Springs, both of Tex.

[73] Assignee: Texas Instruments Incorporated, Dallas, Tex.

[21] Appl. No.: 185,334

[22] Filed: Apr. 21, 1988

Related U.S. Application Data

[63] Continuation of Ser. No. 647,551, Sep. 4, 1984, abandoned.

[51] Int. Cl.$^5$ .............................................. C30B 11/02
[52] U.S. Cl. .................................. 156/616.2; 156/624; 156/DIG. 64; 423/348
[58] Field of Search ...................... 156/600, 607, 616.1, 156/616.2, 616.4, 620.1, 624, DIG. 64, DIG. 66, DIG. 67, DIG. 70, DIG. 73, DIG. 89, DIG. 105, DIG. 111; 423/348; 437/10, 12, 13; 148/DIG. 60

[56] References Cited

U.S. PATENT DOCUMENTS

| | | | |
|---|---|---|---|
| 3,632,438 | 1/1972 | Carlson et al. | 148/DIG. 60 |
| 3,929,529 | 12/1975 | Poponiak | 148/191 |
| 4,430,150 | 2/1984 | Levine et al. | 156/616 A |
| 4,435,209 | 3/1984 | Johansson | 75/10.5 |
| 4,487,651 | 12/1984 | Wang | 156/DIG. 83 |

OTHER PUBLICATIONS

Pamplin, B. R., "Crystal Growth", Pergamon Press (1980), pp. 301–302.

*Primary Examiner*—R. Bruce Breneman
*Attorney, Agent, or Firm*—James C. Kesterson; James T. Comfort; Melvin Sharp

[57] ABSTRACT

A method of making single crystal semiconductor grade silicon spheres for solar cells and the like from metallurgical grade silicon. The process comprises sizing metallurgical grade silicon particles to a desired range and oxidizing the outer surfaces of the particles to form a silicon dioxide skin thereon. The particles are then heated to melt the silicon within the skin to cause impurities to travel into the skin. This is made possible because single crystals are formed. The skin and impurities therein are then etched off and the remaining particles are again treated to form a skin with subsequent melt of the interior silicon and removal of the skin, the cycle being repeated until the desired degree of silicon purity is obtained. An intermediate shotting step can yield spheres of substantially uniform diameter for use as the feed for the repeat cycle.

22 Claims, 1 Drawing Sheet

PRODUCTION OF SEMICONDUCTOR GRADE SILICON SPHERES FROM METALLURGICAL GRADE SILICON PARTICLES

This is a continuation of U.S. application Ser. No. 06/647,551, filed 4/04/84, now abandoned.

CROSS-REFERENCE TO RELATED APPLICATIONS

Applicants' copending application Ser. No. 144,698, filed Jan. 11, 1988, discloses related subject matter. The cross-referenced application and this application are assigned to a common assignee.

BACKGROUND OF THE INVENTION

1. Field of the Invention

This invention relates to a method of forming single crystal silicon spheres of semiconductor grade from particles of metallurgical grade silicon.

2. Description of the Prior Art

In the production of semiconductor devices such as solar cells, integrated circuits, transistors and the like, a basic material utilized is silicon of very high purity. Silicon of the purity required in the production of such devices is not readily available naturally and must be produced commercially.

It has therefore been necessary to purify the metallurgical grades of silicon in any one of many standard and well known manners. A problem is that semiconductor grade silicon, due to the costly processing techniques required for purification, is extremely expensive. It is therefore the desire in the art to provide elemental silicon of semiconductor grade which can be produced from the available natural sources of silicon more inexpensively than can be obtained by presently known techniques.

SUMMARY OF THE INVENTION

In accordance with the present invention, there is provided a method whereby single crystal silicon spheres of semiconductor grade can be provided from metallurgical grade silicon and which can be produced at a fraction of the present cost of preparation of semiconductor grade silicon from metallurgical grade silicon. Though the entire discussion is directed to silicon, germanium and gallium arsenide can be substituted herein for silicon.

Briefly, in accordance with the present invention, metallurgical grade silicon of any type is provided in small irregular particles corresponding in volume approximately to that of an irregular sphere of about 0.025 to 1.000 centimeters in diameter. The preferable shape of the particles is spherical though the method will operate satisfactorily for shapes other than spherical. The metallurgical grade appropriately sized silicon starting material is provided in any one of a number of ways. For example, metallurgical grade silicon can be crushed and passed through appropriate screens in well known manner to provide particles which are in a predetermined mesh range, this range being predetermined to provide volumes generally of the type noted hereinabove. The silicon starting material may also be produced by one of many atomization processes such as the process described in U.S. Pat. No. 4,188,177. The particles of desired size are then removed and treated initially in accordance with the procedures set forth in U.S. Pat No. 4,430,150 of Levine et al., which disclosure is incorporated herein by reference.

In accordance with the procedure set forth in the Levine at al. patent, it is required that the particles be coated with or have a coating formed of a skin of a dissimilar material, such as silicon oxide, with the material inside each skin then being melted and thereafter cooled in such a way that the molten material solidifies in a single crystal structure with the skin remaining around the single crystal structure. While the Levine et al. patent is only concerned with single crystal silicon formation, it has now been determined by the applicants herein that, during formation of single crystal silicon in accordance with the methods provided in the above noted Levine at al. patent, the skin of dissimilar material acts as a getter and attracts impurities thereto located in the semiconductor grade silicon as used therein or from metallurgical grade silicon particles. The skin is subsequently removed by etching. Accordingly, is has been found that, by utilizing the concepts of the Levine et al. patent on a repeated basis, with removal of the skin after each remelt operation with slow cooling cycles, metallurgical grade silicon can be used as a starting material with the silicon ultimately being purified to the desired degree to provide spheres of single crystal semiconductor grade silicon. Such spheres are of particularly great utility in the field of solar cells as is well known. This process is only made possible because the oxide remelt step produces single crystal material, and the greatest quantity of impurities is swept from the core to the skin in a single crystal Otherwise impurities would collect at the grain boundaries, and it would be impossible to remove them by etching since they would not generally reach the skin layer.

The procedure in accordance with the present invention for producing the semiconductor grade silicon involves providing particles of metallurgical grade silicon by any of the prior art methods, as discussed above, which are sized in the manner noted above so that the small particles correspond in volume approximately to that of a sphere of about 0.025 to 0.100 centimeters in diameter, the particles preferably being spherical or near spherical in shape though this is not an absolute requirement. The metallurgical grade silicon particles are then operated upon in a simpler manner to that described in the above noted Levine et al. patent. The particles are raised to a temperature of preferably about 1430° C. to about 1500° C., but in no event above 1550° C., at one atmosphere of oxygen pressure and retained at that temperature for about 2 minutes while melting of semiconductor material takes place. This operation contains a high fraction of oxygen in the atmosphere so that any breaks or ruptures in the skin will be repaired by way of oxidation. The skin also prevents adjacent particles from coalescing while the self-packed silicon is in the molten state. In this molten state, the particles tend to become spherical in character because of the surface tension forces which are present. The thin silicon oxide skin is sufficiently plastic at this temperature to allow the particles to spheroidize. Also, during the period in which the silicon is in the molten state, impurities travel rapidly therethrough and are attracted to the silicon oxide skin where the impurities collect. After cooling, the skin is removed by etching in hydrofluoric acid in a manner well known in the art. At this point, spherical particles of single crystal silicon remain which display greater purity than the starting metallurgical grade silicon. A separate shot step of well known type can now be performed on the particles after heating to melting to form uniform size particles for the feed for the subsequent particle upgrading procedure. The procedure is repeated with the spheres again being provided with a silicon oxide skin and melting of the silicon therein again taking place to drive further impurities into the silicon oxide skin. Upon completion of slow cooling, the skin is again removed by etching, this procedure being repeated until the required degree of purity of silicon has been achieved. At this point the spheres can be operated upon in appropriate manner, such as to diffuse impurities therein or the like, as required.

Because of the segregation coefficient of impurities in silicon and the single crystal structure of the spheres, substantially all of the impurities should eventually, after repeated processing cycles, end up at the surface where they can be captured in the silicon oxide skin layer and then etched off. It is also readily apparent that, though spherical particles as starting materials are preferred, the method as utilized herein will spheroidize particles of almost any shape during the process. In the above described manner, single crystal silicon spheres of semiconductor quality are obtained starting with metallurgical grade spherical and/or nonspherical particles, the cost being substantially reduced relative to prior art methods.

DESCRIPTION OF THE PREFERRED EMBODIMENT

Figure 1:
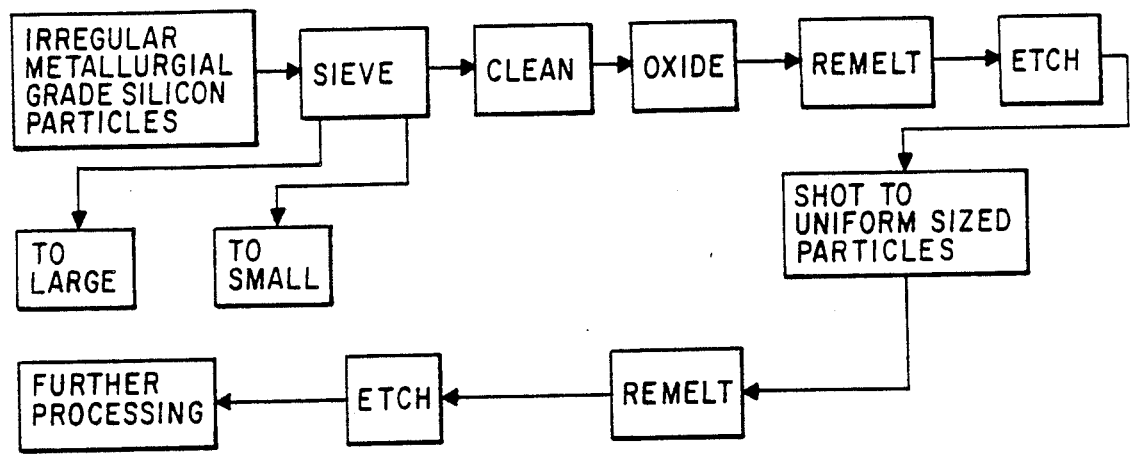
FIG. 1 is a schematic diagram of the process utilized in forming single crystal spheres of semiconductor grade silicon from particles of metallurgical grade silicon.

Referring now to FIG. 1, there is shown a schematic diagram of the process steps required to provide single crystal silicon spheres of semiconductor grade from particles of metallurgical grade silicon. The starting material is irregularly shaped metallurgical grade silicon particles which can be formed by crushing or the like. These particles are placed in a sieve wherein those particles that are too large or too small for the process are removed and the particles in the desired range which correspond in volume to that of a sphere of about 0.025 centimeters in diameter are retained, the shapes preferably being nearly spherical though this is not an absolute requirement. The diameter size is chosen so that the particles are sufficiently large to provide a sufficiently large end product after removal of oxide layers during the processing steps. Therefore, there is no criticality to the particle size noted hereinabove except that uniformity of particle sizes is desirable to provide a uniformly sized end product. The particles can then be cleaned by surface treatment, leaching or the like.

The particles are raised to a temperature of preferably about 1430° C. to 1500° C. but not above 1550° C. at one atmosphere of oxygen pressure and retained at that temperature for about 2 minutes while melting of semiconductor material takes place. This operation is in an atmosphere of oxygen which will react to reseal any rupture in the skin that may develop and will otherwise aid in maintaining the integrity of the skin by continuously oxidizing the silicon. The skin also prevents adjacent particles from coalescing while the self-packed silicon is in the molten state. When molten, each individual particle tends to change its shape to become more spherical in character because of the surface tension forces which are present. The thin $SiO_2$ skin is sufficiently plastic at this temperature to allow the particles to spheroidize. When the silicon is in this molten state, impurities therein are capable of diffusing therethrough very quickly and are gathered up in great part by the silicon dioxide skin which acts as a getter. After the particles have become molten and impurities have travelled to the oxide skin, the heating energy is reduced and the molten spheres are cooled. The cooling rate of the silicon particles through the melting point is inherently slow, such as by removing furnace power but maintaining the furnace closed. This procedure favors single crystal growth. Nearly 100% of the remelted spheres produced by this process are single crystal and essentially defect free. The spheres are then etched in a hydrofluoric acid etch in well known manner to remove the silicon oxide skins and all impurities therein. While a large amount of the impurity from the metallurgical grade silicon has now been removed, the single crystal silicon spheres of somewhat spheroid shaped particles that remain will probably not be semiconductor grade after one cycle of remelt and etch as just described. Accordingly, the steps of oxidizing the surfaces of the spheres in the manner just described with subsequent remelt and etch can be repeated as many times as required to obtain the silicon purity level necessary. The preferred embodiment herein discloses two such steps with the dotted line therein indicating that additional remelt and etch cycles can be added as desired. A separate shot step can also be included as shown. Here the upgraded metallurgical grade silicon is melted and then shotted to form uniform-size particles. These serve as the feed for the next upgrade procedure. When the desired properties have been obtained, further processing of the spheres, which are now single crystals of semiconductor grade silicon, is provided for the desired purposes.

Figure 2:
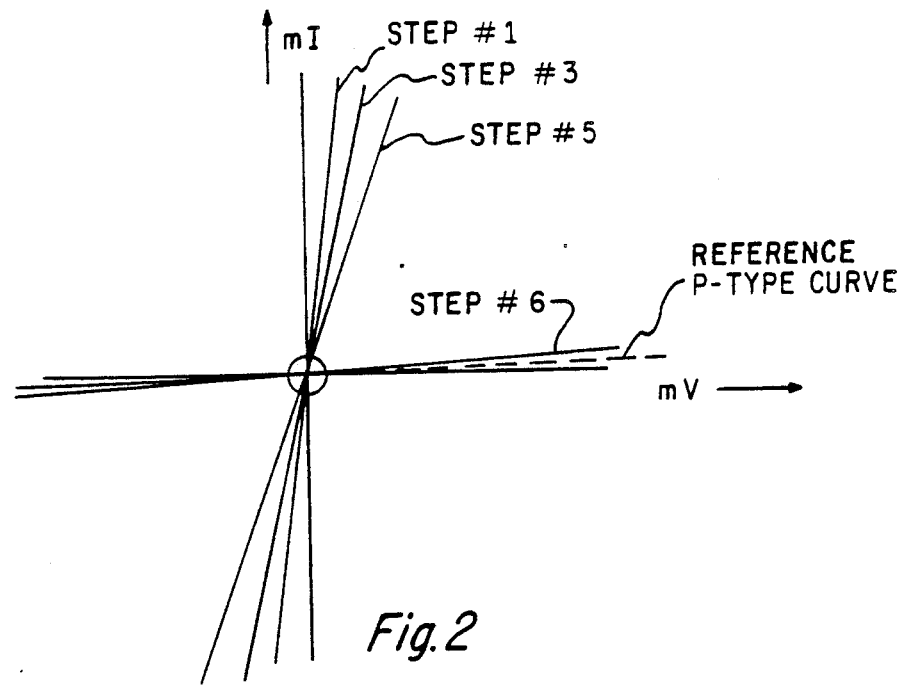
FIG. 2 is an I-V curve showing conductivity of spheres at various points in the process.

Referring now to FIG. 2, which is an I-V curve of a silicon sphere at various processing stages as provided in accordance with the present invention, it can be seen that after one step of oxidizing and remelt in No. 1 the sphere displayed substantially conductor properties, these properties becoming more semiconductive after three cycles as shown in No. 3 and five cycles as shown in No. 5. After six cycles, as shown in No. 6, semiconductor grade single crystal silicon spheres were obtained. It is therefore readily apparent that the method as described above is capable of very inexpensively converting metallurgical grade silicon particles of any type, single crystal or otherwise, and of spherical or irregular shape, to spheres of semiconductor grade single crystal silicon for use in solar cells and the like.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

what is claimed is:

1. A method of forming high purity semiconductor material from relatively low purity semiconductor material, comprising the steps of:

(a) treating particles of relatively low purity semiconductor material to form a skin thereon of a thermally stable compound;

(b) melting the material within said skin while retaining said molten material within said skin to cause impurities in said material to travel into said skin;

(c) cooling the material to form a single crystal solid material within said skin;

(d) removing said skin from said particles; and (e) repeating at least once the steps (a) through (d) on said particles.

2. A method as set forth in claim 1 wherein said low purity particles are of irregular shape.

3. A method as set forth in claim 1 further including the step of making said particles of more uniform size distribution prior to step (e).

4. The method of claim 1, wherein:
(a) said steps (a) through (d) are repeated at least five times on said particles.

5. A method as set forth in claim 1 wherein step (b) comprises heating the particles to a temperature in the range of about 1430° C. to not above 1550° C. in an oxygen rich atmosphere for about 2 minutes.

6. A method as set forth in claim 5 wherein said low purity particles are of irregular shape.

7. A method as set forth in claim 1 wherein step (a) comprises treating said particles in a reactive gaseous atmosphere to form said skin and step (b) comprises melting said material in an oxidizing gas environment.

8. A method as set forth in claim 7 wherein said low purity particles are of irregular shape.

9. A method as set forth in claim 7 wherein step (b) comprises heating the particles to a temperature in the range of about 1430° C. to not above 1550° C. in an oxygen rich atmosphere for about 2 minutes.

10. A method as set forth in claim 9 wherein said low purity particles are of irregular shape.

11. A method as set forth in claim 1 wherein said semiconductor material is taken from the group consisting of silicon, germanium and gallium arsenide.

12. A method as set forth in claim 11 wherein said low purity particles are of irregular shape.

13. A method as set forth in claim 11 wherein step (b) comprises heating the particles to a temperature in the range of about 1430° C. to not above 1550° C. in an oxygen rich atmosphere for about 2 minutes.

14. A method as set forth in claim 13 wherein said low purity particles are of irregular shape.

15. A method as set forth in claim 7 wherein said semiconductor material is taken from the group consisting of silicon, germanium and gallium arsenide.

16. A method as set forth in claim 15 wherein said low purity particles are of irregular shape.

17. A method as set forth in claim 15 further including the step of making said particles of more uniform size distribution prior to step (e).

18. A method as set forth in claim 15 wherein step (b) comprises heating the particles to a temperature in the range of about 1430° C. to not above 1550° C. in an oxygen rich atmosphere for about 2 minutes.

19. A method as set forth in claim 18 further including the step of making said particles of more uniform size distribution prior to step (e).

20. A method as set forth in claim 18 wherein said low purity particles are of irregular shape.

21. A method as set forth in claim 20 further including the step of making said particles of more uniform size distribution prior to step (e).

22. The method of claim 1, wherein:
after said steps (a) through (e) are performed said solid material is single crystal.

* * * * *